United States Patent [19]

Bell

[11] Patent Number: 4,926,144
[45] Date of Patent: May 15, 1990

[54] MULTI-FUNCTION MODULATION AND CENTER FREQUENCY CONTROL PORT FOR VOLTAGE CONTROLLED OSCILLATOR

[75] Inventor: Robert K. Bell, Lynchburg, Va.

[73] Assignee: General Electric Company, Lynchburg, Va.

[21] Appl. No.: 250,760

[22] Filed: Sep. 29, 1988

[51] Int. Cl.⁵ .......................... H03C 3/08; H03C 3/09; H03C 3/22
[52] U.S. Cl. ..................................... 332/124; 332/127; 332/136; 331/23; 331/36 C; 331/177 V; 455/113
[58] Field of Search .................. 332/18, 19, 30 V, 124, 332/127, 136; 331/23, 36 C, 117 V; 455/113

[56] References Cited

U.S. PATENT DOCUMENTS

| | | | |
|---|---|---|---|
| 3,227,968 | 1/1966 | Brounley | 332/30 V X |
| 3,293,571 | 12/1966 | Bott | 332/30 V X |
| 3,579,281 | 5/1971 | Kam et al. | 332/19 X |
| 4,303,894 | 12/1981 | Akazawa | 332/16 T |
| 4,442,415 | 4/1984 | Ashida | 331/16 T |
| 4,458,215 | 7/1984 | Huang et al. | 331/117 D |
| 4,470,024 | 9/1984 | Leuenberger | 331/108 D |
| 4,518,933 | 5/1985 | Kroner | 331/108 D |
| 4,607,238 | 8/1986 | Kohsiek | 331/143 |
| 4,633,197 | 12/1986 | Vanderspool, II | 332/16 T |
| 4,721,926 | 1/1988 | Aota | 332/16 T |
| 4,721,927 | 1/1988 | Aota et al. | 332/16 T |
| 4,748,425 | 5/1988 | Heck | 332/19 |

*Primary Examiner*—Siegfried H. Grimm
*Attorney, Agent, or Firm*—Nixon & Vanderhye

[57] ABSTRACT

A circuit for use in conjunction with a voltage controlled oscillator (VCO). The circuit introduces modulation into a radio system (to create a substantially flat frequency response) at the same VCO port at which VCO frequency centering and negative bias control signals are introduced. A potentiometer is utilized both for providing an adjustable negative bias to the varactor in the VCO resonant circuit and for setting the VCO to the appropriate center frequency. Modulation compensation circuitry is coupled to the control arm of the potentiometer and to the anode of the varactor (via a choke 4). The modulation compensating circuitry is preferably designed to have a transfer function that is substantially the inverse of the closed loop transfer function of the phase locked loop system with respect to the frequency modulation of the VCO.

20 Claims, 1 Drawing Sheet

MULTI-FUNCTION MODULATION AND CENTER FREQUENCY CONTROL PORT FOR VOLTAGE CONTROLLED OSCILLATOR

FIELD OF THE INVENTION

This invention generally relates to voltage controlled oscillators. More particularly, the invention relates to apparatus for introducing modulation, centering the voltage controlled oscillator's (VCO's) operating frequency range and introducing a negative bias voltage at a single VCO port.

BACKGROUND AND SUMMARY OF THE INVENTION

Mobile radio transceivers typically derive their operating frequencies with a phase locked loop frequency synthesizer. In such a synthesizer, a phase locked loop circuit controls a variable frequency oscillator, i.e., a voltage controlled oscillator (VCO), to lock in at the frequency and phase angle of a standard or reference frequency. In this fashion, the VCO will have the same accuracy as the standard. The phase locked loop operates to track the operation of the reference oscillator.

In general, a phase locked loop includes a VCO, a reference oscillator, a phase detector and a loop filter. The phase detector compares the phase of the VCO output signal with the phase of the signal from the reference oscillator. The phase detector generates an error signal related to the difference between the two compared signals. This output signal is processed by a low pass filter and is then applied as a control signal to an input terminal of the VCO to control the frequency of the oscillator output signal.

As in many other electronic technologies, over the last decade the competitive marketplace and the consuming public continuously demand mobile radios which include more functions but which are smaller and less expensive than currently existing radios. With respect to mobile radio size, as cars have tended to become smaller, the need has arisen for mobile radios which are also more compact. Accordingly, developments in the mobile radio communications art which eliminate redundant circuitry or which otherwise permit a radio to be made smaller or to be manufactured at a lower cost are extremely significant developments.

The present invention serves to eliminate redundant mobile radio circuitry by uniquely implementing three functions which heretofore have been implemented as discrete functions requiring two or more separate frequency synthesizer ports. More specifically, the present invention uses one VCO port to input signals for introducing modulation, centering the VCO operating frequency range and for introducing a negative bias voltage for optimally biasing the VCO tuning varactor. These functions are implemented so as to reduce the cost and complexity conventionally associated with providing extra circuits and pins for implementing related functions.

In the prior art, modulation signals are generally applied to the VCO at a separate port and are typically introduced across a dedicated varactor to achieve frequency modulation of the VCO frequency. In synthesizers designed for land mobile radios, the closed loop bandwidth of the synthesizer creates a high pass modulation response with decreasing deviation below the loop bandwidth for signals introduced into the VCO. Several trade-offs are balanced in the selection of the exact bandwidth, but in most cases involving frequent channel changes, the bandwidth is between 20 and 100 Hz.

The common use of frequency dividers in phase locked loops to create locking of the VCO to a single reference frequency creates a change in the loop bandwidth as different channels are selected. As a result, it is difficult to obtain consistent deviation for frequencies at or below the frequency bandwidth.

One mechanism that has been utilized to obtain a flat modulation response is to modulate both the reference oscillator and the VCO. It is, however, undesirable in many applications to modulate the reference source due to increased phase locked loop complexity and associated extra costs.

As will be explained in detail below, the present invention instead of introducing modulation at several points in the phase locked loop and instead of utilizing a dedicated modulation input port, introduces modulation into the system to create a substantially flat frequency response at the same VCO port at which VCO frequency centering and negative bias control signals are introduced.

Frequency centering is an important adjustment which permits an operator to center the VCO in the range over which the radio is designed to operate. In this regard, when a mobile radio is manufactured, the radio is typically not set at an optimum frequency at the precise center of the operating range.

Most VCO's need to be set to a predetermined center frequency to insure proper operation. The methods typically utilized in conventional radios to set the radio to a particular frequency involve using (1) a tunable inductor having a solenoid winding with a metal, ferrite, or powdered iron core (or a helical coil which is tuned by an adjustable element whose proximity to the coil changes its resonant frequency), (2) a tunable capacitor, or (3) a microstrip line whose physical characteristics may be mechanically adjusted.

These prior art techniques for centering the VCO frequency suffer from significant disadvantages. In this regard, the movable elements of a tunable inductor or tunable capacitor are potential sources of unwanted modulation in the VCO since mechanical vibration applied to the oscillator can move the adjustable components creating a frequency shift related to the frequency vibration. Microstrip lines are susceptible to detuning by changes in proximity of surrounding components and shields.

In the present invention, a potentiometer is utilized both for providing a negative bias to the varactor in the VCO resonant circuit and for setting the VCO to the appropriate center frequency. Moreover, the signals which provide the appropriate VCO frequency centering and negative bias signals to the VCO are introduced at the same VCO port at which the modulation input signal is introduced to the VCO.

In conventional radios, the control voltage which tunes the oscillator and which is typically coupled to the cathode of a VCO tuning varactor is typically utilized to reverse bias the VCO tuning varactor(s). The anode of the varactor in such a configuration is grounded. The present invention provides an adjustable negative bias voltage to the anode of the VCO tuning varactor diode to force the diode to consistently operate at a minimum of 1 volt reverse bias which is a more desirable negative bias voltage than is typically provided by the VCO control voltage.

BRIEF DESCRIPTION OF THE DRAWINGS

These as well as other objects and advantages of this invention will be better appreciated by reading the following detailed description of the presently preferred exemplary embodiment taken in conjunction with the accompanying drawings of which.

DETAILED DESCRIPTION OF THE DRAWINGS

Figure 1:
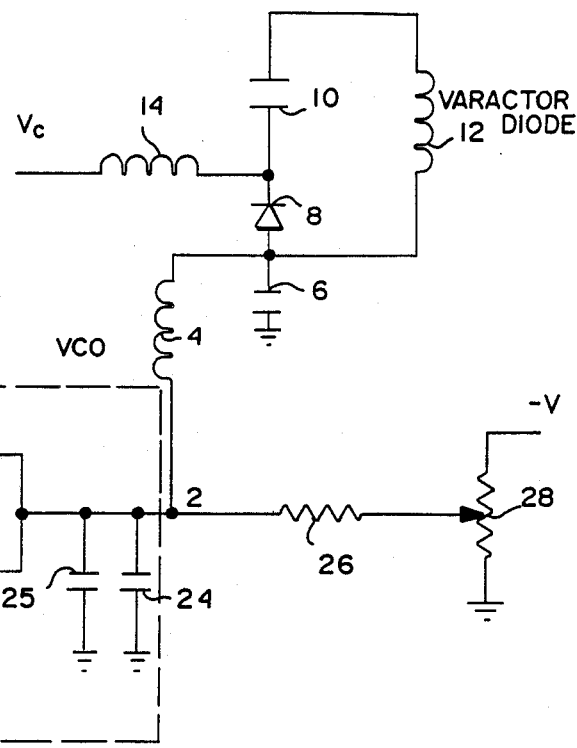
FIG. 1 is a schematic diagram showing one implementation of an exemplary embodiment of the present invention in which modulation signals, VCO frequency centering signals and negative bias control signals are introduced to the VCO using a single VCO port.

The circuit shown in FIG. 1 is an exemplary embodiment of the present invention and implements each of the three functions described above so as to use only one VCO input port by introducing signals to the VCO at a single node 2. As will be described in detail below, signals are introduced via node 2 which provide (1) a modulation input to compensate for the synthesizer frequency modulation response, (2) VCO operating frequency range centering and (3) a negative bias to the varactor 8 in the VCO.

The VCO, which is coupled to the circuitry shown in FIG. 1 at a single node 2, may be any of a number of conventional voltage controlled oscillators. Such an oscillator typically uses at least one semiconductor capacitive diode, i.e., varactor 8, whose capacitance varies with the amount of reverse voltage applied across it. When such a capacitive diode is placed across an inductor in the oscillator's tuned circuit, the oscillator frequency may be varied by controlling the DC voltage across the diode.

Turning to FIG. 1, coupled to node 2 is an inductor 4, which is a choke that provides high impedance to alternating current while offering virtually no opposition to direct current and which acts essentially as an open circuit at the RF frequency. Choke 4 is coupled to a capacitor 6 which acts as a short circuit at the RF frequency and which is grounded.

Choke 4 and capacitor 6 are each coupled to the anode of varactor 8 whose cathode is coupled to capacitor 10. Inductor 12 is connected across capacitor 10 and varactor 8. The combination of semiconductor capacitive diode 8, capacitor 10 and inductor 12 form the VCO's resonant circuit. As is conventional, the resonant circuit shown in FIG. 1 is coupled to a VCO active device provided with the required feedback to oscillate at controlled frequencies. The VCO may be configured as a conventional Colpitts type oscillator. It should be recognized however, that the present invention may be applied with any VCO which utilizes varactor tuning.

The VCO control or error voltage from the phase locked loop phase detector (not shown) and loop filter (not shown) is introduced as $V_c$ via choke 14, which blocks alternating current but allows direct current to pass to reverse bias diode 8. Thus, in the circuit shown in FIG. 1, the capacitance of diode 8 may be raised or lowered by the control or error voltage $V_c$ which is applied to the diode cathode and the DC voltage applied to the diode anode via node 2 and choke 4.

A modulation input signal is coupled from a modulation source (not shown) directly to the anode of varactor 8 via modulation compensation network 15 and node 2. Such direct coupling to the varactor 8 yields a modulation sensitivity approximately equal to the VCO tuning sensitivity. This sensitivity which is on the order of several MHz per volt is much larger than is required for normal voice modulation occurring between 300 and 3000 Hertz at deviations up to 5 KHz. The availability of the extra deviation aids in the design of the modulation compensation network 15, whose operation is described in detail below.

The modulation input signal is coupled from the modulation source to compensation network 15, via potentiometer 16. The resistance setting of potentiometer 16 is adjusted to insure that the radio does not deviate outside the plus or minus 5 KHz limit as required by the FCC. As will be appreciated by those skilled in the art, a conventional radio will include a limiter (associated with the modulation signal processing circuitry) which prevents signals from being generated which have an amplitude above a predetermined level no matter how loud a conversation may be, by clipping signals above a predetermined peak to peak voltage. Such clipped signals are applied to potentiometer 16 which is adjusted to result in, for example, a 4½ KHz deviation to thereby insure that the FCC deviation of 5 KHz will not be exceeded.

Figure 2A:
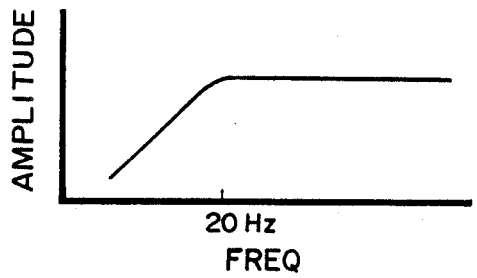
FIGS. 2A, 2B, and 2C are plots of the VCO frequency response, modulation compensation frequency response generated by circuit 15 of FIG. 1 and the combined frequency response, respectively.

The compensating circuitry 15, which is coupled to the control arm of potentiometer 16, is preferably designed to have a transfer function which is substantially the inverse of the closed loop transfer function of the phase locked loop system with respect to frequency modulation of the VCO. In this regard, FIG. 2A shows the VCO response with respect to frequency modulation applied to the VCO which evidences the inherent high pass character of the phase locked loop response. The modulation response, while relatively flat for higher frequencies decreases rapidly for low frequencies exhibiting, for example, a 6 dB low frequency cut off at a corner frequency of, for example, 20 Hz.

Compensation network 15 is interposed between the modulation source and an input to the VCO via node 2 so that the resulting modulation response of the combined network will be a substantially flat frequency response. Thus, the interposed network 15 should be designed to synthesize a transfer function such that the product of the closed loop transfer function of the phase locked loop system with respect to frequency modulation of the VCO multiplied by the transfer function of the interposed network is equal to a constant.

Figure 2B:
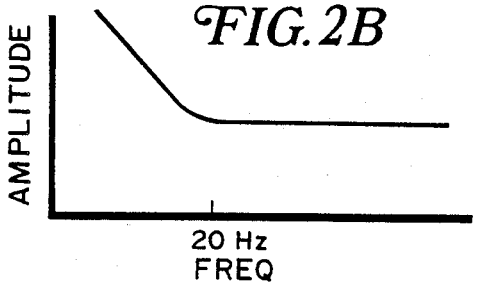
Figure 2C:
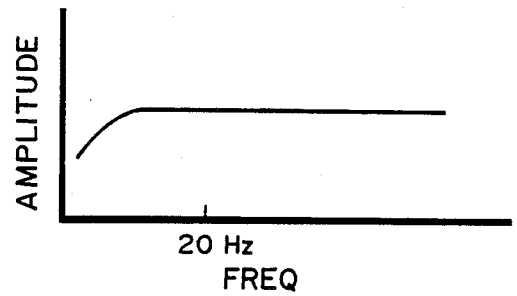

FIG. 2B shows an exemplary transfer function to be synthesized by compensation network 15, which is the inverse of the VCO response shown in FIG. 2A. As shown in FIG. 2C, the combined response of the interposed compensation network 15 and the VCO modulation response is substantially flat with the corner frequency being shifted to a much lower frequency than the original 20 Hertz corner frequency shown in FIG. 2A.

Compensation network 15 is a passive network which boosts the low frequency gain of the modulation input to compensate at least partially for the high pass modulation response of the phase locked loop. If more precise modulation compensation is desired further details regarding additional compensating circuitry which may be coupled to network 15 is disclosed in the commonly assigned application Ser. No. 07/244,498 of Vandegraaf, entitled "Phase Locked Frequency Synthesizer With Single Input Wideband Modulation System" filed on Sept. 15, 1988 now U.S. Pat. No. 4,988,404 and the application Ser. No. 07/244,399 of Vandegraaf entitled "Phase Locked Frequency Synthesizer With Single Input Gain Compensator Wideband Modulation System" filed on Sept. 15, 1988, now U.S. Pat. No. 4,864,257, which patents are hereby expressly incorporated by reference.

It should be recognized that the low frequency VCO response shown in FIG. 2A is not necessarily a well defined linear function. In order to provide compensation for low frequency digital "channel guard" modulation, it is necessary to provide an additional stage of low frequency gain boost in addition to the passive RC network shown in compensating network 15 in FIG. 1. Thus, at least one other pole of low frequency boost may be coupled in series to compensating network 15. Such a compensating stage may be disposed between a digital channel guard source (not shown) and pin A of potentiometer 16. Such an additional compensating stage may be of the type disclosed in the aforementioned Vandegraaf applications which incorporate an operational amplifier to provide a low frequency boost stage. In any event, utilizing the RC network shown in FIG. 1 to provide low frequency boost in conjunction with an active element stage, eliminates the need to provide an additional operational amplifier and avoids low frequency noise problems which may be associated therewith.

Turning back to FIG. 1, capacitor 18 of compensation network 15 is coupled to the wiper of potentiometer 16 and is also connected in series with resistor 20. Additionally, the potentiometer wiper is coupled to capacitor 22 which in turn is connected in parallel to series coupled capacitor 18 and resistor 20. Capacitor 22 and resistor 20 are in turn connected to capacitors 25 and 24 and node 2. As shown in FIG. 1, capacitors 24 and 25 are grounded.

Focusing first on capacitors 22 and 25, when a frequency of, for example, 1 KHz is applied to pin B of potentiometer 16, capacitors 22 and 25 form a capacitive voltage divider. As the frequency (above the network corner frequency) changes, the reactances of capacitors 22 and 25 track the frequency so that the voltage at node 2 remains constant with the applied frequency. The capacitive voltage divider serves to reduce the amount of voltage applied to the VCO via node 2 above a predetermined corner frequency so as to aid in generating the inverse of the VCO response shown in FIG. 2A. The voltage divider in conjunction with capacitor 18 and resistor 20 serves to provide some of the low frequency boost required to compensate for the high pass response of the phase locked loop.

The capacitive voltage divider formed by capacitors 22 and 25 provides a 5 Khz nominal deviation at 1 Khz modulation frequency when a nominal level of 1 volt peak to peak is applied to terminal B of potentiometer 16. Typically, the modulation voltage applied to pin A of potentiometer 16 is on the order of 2 volts peak to peak. If the potentiometer 16 is set to the center of its range then a 1 volt peak to peak is applied at pin B. Pin C of potentiometer 16 is grounded (as shown in FIG. 1).

Capacitor 18 and resistor 20 serve to short capacitor 22 beginning at a predetermined corner frequency. Resistor 20 and capacitor 18 provide a decreasing loss of 6 dB per octave below the frequency where resistor 20 is equal to the magnitude of the reactance of capacitor 22. Above the corner frequency (which is shown in FIG. 2 as being 20 Hz), the reactance of capacitor 22 becomes lower than the reactance of resistor 20 and capacitor 18 and therefore at such frequencies, the reactance of capacitor 22 becomes the dominant reactance in the RC network. The capacitor 18 and resistor 20 form the portion of the network providing a significant low frequency boost.

Capacitor 25 in addition to serving as a portion of the voltage divider described above, also serves to decouple noise associated with the negative bias supply voltage $-V$. In this regard, it is noted that to generate the negative bias supply voltage, an oscillator output is typically rectified which results in the generation of noise which would otherwise serve to undesirably modulate the VCO via node 2. Capacitor 25 and capacitor 24 serve as low impedance paths to ground for such noise. It is noted that capacitors 25 and 24 also create a low AC impedance at the anode of varactor 8.

Capacitor 25 shown in FIG. 1 may, for example, be a capacitor on the order of 20 microfarads. At frequencies on the order of a few hundred kilohertz capacitor 25 ceases to operate as a capacitor and has negligible impact on the circuit. For this reason, capacitor 24, which will function as a capacitor at higher frequencies to provide RF bypassing is coupled in parallel to capacitor 25. Capacitor 24 may, for example, have a capacitance of 1000 picofarads.

The negative bias supply voltage $-V$ is generated by a source having a high source impedance. In this regard, it is noted that if this negative bias supply voltage source is unduly loaded, then instead of getting the required negative bias voltage at node 2, it is possible that no voltage would be generated at node 2. Capacitor 18 in addition to contributing to the low frequency boost also operates as a DC blocking capacitor to prevent the loading of the negative bias supply $-V$.

The negative bias voltage $-V$ is coupled through potentiometer 28 and resistor 26 to provide via node 2 an adjustable reverse bias voltage to the anode of the tuning varactor 8. Potentiometer 28 is used to adjust the center frequency of the VCO by adjusting the value of the reverse bias applied to tuning varactor 8.

The high impedance of potentiometer 28 and resistor 26 plays a significant role in the proper operation of the circuitry shown in FIG. 1. It is noted that at low frequencies, capacitors 22 and 25 offer very high impedances. If a resistive component to ground appeared at node 2, the frequency response of 18, 20, 22, and 25 would be undesirably modified. The RC network 18, 20, 22 and 25 is designed to generate signals into an essentially open circuit. Thus, resistor 26 is coupled to node 2 to create a high impedance to permit the compensating circuit 15 to operate properly at low frequencies. Resistor 26 preserves the low frequency modulation response discussed above by limiting the resistive impedance at port 2 to be no less than some minimum value.

It is further noted that capacitor 25 when chosen, as noted above, to provide low frequency noise attenuation also serves to attenuate any variations in the negative bias due to mechanical vibration of the adjustable potentiometer 28 and thus, improves the synthesizer's mechanical stability. This external adjustment also allows selection of a fixed inductor in the oscillator resulting in a lower cost and a more mechanically sound design.

By virtue of the components coupled to node 2 of FIG. 1, the VCO frequency may be centered and the varactor diode 8 may be reverse biased more fully than it could otherwise be using only the control voltage Vc, thereby resulting in better oscillator performance. Additionally, the required compensating modulation voltage is also summed into node 2 and is coupled to the anode of varactor diode 8.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a radio including a phase locked loop having a voltage controlled oscillator (VCO), said VCO including VCO tuning means for varying the VCO's output frequency, said VCO including a first port coupled to said VCO tuning means, apparatus coupled to said first port comprising:
   modulation compensation means coupled to a modulation source and to said first port for boosting low frequency signals received from said modulation source for providing a compensated modulation signal to said VCO tuning means via said first port; and
   means coupled to said first port and said modulation compensation means for providing a negative bias voltage to said VCO tuning means via said first port, said means for providing a negative bias voltage including means for adjusting the center frequency of the VCO.

2. Apparatus according to claim 1, wherein said modulation compensation means includes voltage divider means for generating an output voltage which varies with the frequency of the modulation signals applied thereto.

3. Apparatus according to claim 1, wherein said modulation compensation means for boosting low frequency signals includes resistor means coupled in series with a capacitor means.

4. Apparatus according to claim 2, wherein said voltage divider means includes a first capacitor coupled to a second capacitor; said compensation means further including a first resistor coupled in series with a third capacitor, said first resistor and said third capacitor being coupled across said first capacitor.

5. Apparatus according to claim 2, wherein said voltage divider means includes means for decoupling noise associated with said means for providing a negative bias voltage.

6. Apparatus according to claim 5, wherein said means for decoupling noise includes capacitor means for providing a low impedance path to ground for said noise.

7. Apparatus according to claim 1, wherein said means for providing a negative bias voltage includes means, coupled to the output of said modulation compensation means, for presenting a predetermined high impedance at the output of said modulation compensation means.

8. Apparatus according to claim 1, wherein said means for adjusting the center frequency includes means for adjusting the value of the negative bias voltage applied to the tuning means.

9. In a radio having a phase locked loop including a voltage controlled oscillator (VCO) having VCO tuning means for varying the VCO's output frequency, said VCO having a first input port coupled to said VCO tuning means, apparatus coupled to said first port comprising:
   modulation input means coupled to a modulation source and to said first port, for boosting low frequency signals received from said modulation source for providing a compensated modulation signal to said first port; and
   means coupled to said modulation input means and to said first port for adjusting the center frequency of said VCO, said means for adjusting the center frequency including means for applying a reverse bias voltage to the VCO tuning means.

10. Apparatus according to claim 9, wherein said modulation input means includes voltage divider means for generating an output voltage which varies with the applied modulation frequency.

11. Apparatus according to claim 10, wherein said voltage divider means includes a first capacitor coupled to a second capacitor; said modulation input means further including a first resistor coupled in series with a third capacitor, said first resistor and said third capacitor being coupled across said first capacitor.

12. Apparatus according to claim 10, wherein said voltage divider means includes means for decoupling noise by providing a low impedance path to ground for said noise.

13. Apparatus according to claim 9, wherein said means for applying a reverse bias is adjustable.

14. In a radio having a phase locked loop including a voltage controlled oscillator (VCO) having a VCO tuning means for varying the VCO's output frequency, said phase locked loop having a predetermined closed loop transfer function, said VCO including a first port coupled to said VCO tuning means, apparatus coupled to said first port comprising:
   means for continuously providing an adjustable negative bias voltage to said VCO tuning means via said first port, said means for providing an adjustable negative bias including means coupled to said first port for adjusting the center frequency of said VCO, and
   modulation compensation means coupled to said first port and having a closed loop transfer function which is substantially the inverse of said predetermined closed loop transfer function for receiving signals from a modulation source and for generating a compensated modulation signal.

15. Apparatus according to claim 14, wherein said modulation compensation means includes means for boosting low frequency signals received from said modulation source.

16. Apparatus according to claim 15, wherein said modulation compensation means includes voltage divider means for generating an output voltage which varies with the applied modulation frequency.

17. Apparatus according to claim 16, wherein said voltage divider means includes a first capacitor coupled to a second capacitor; said compensation means further including a first resistor coupled in series with a third capacitor, said first resistor and said third capacitor being coupled across said first capacitor.

18. Apparatus according to claim 16, wherein said voltage divider means includes means for decoupling noise associated with said means for providing a negative bias voltage.

19. Apparatus according to claim 15, wherein said means for providing a negative bias voltage includes means, coupled to the output of said modulation compensation means, for presenting a predetermined high impedance at the output of said modulation compensation means.

20. Apparatus according to claim 14, wherein said means for providing an adjustable negative bias voltage includes a potentiometer.

* * * * *